US012490634B2

(12) United States Patent
Duan

(10) Patent No.: US 12,490,634 B2
(45) Date of Patent: Dec. 2, 2025

(54) DISPLAY PANEL

(71) Applicant: Shenzhen China Star Optoelectronics Semiconductor Display Technology Co., Ltd., Guangdong (CN)

(72) Inventor: Shaofeng Duan, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/779,604

(22) PCT Filed: May 19, 2022

(86) PCT No.: PCT/CN2022/093783
§ 371 (c)(1),
(2) Date: May 25, 2022

(87) PCT Pub. No.: WO2023/206662
PCT Pub. Date: Nov. 2, 2023

(65) Prior Publication Data

US 2024/0164186 A1 May 16, 2024

(30) Foreign Application Priority Data

Apr. 27, 2022 (CN) ......................... 202210458577.1

(51) Int. Cl.
*H10K 59/00* (2023.01)
*H10K 59/122* (2023.01)
*H10K 59/80* (2023.01)

(52) U.S. Cl.
CPC ......... *H10K 59/874* (2023.02); *H10K 59/122* (2023.02); *H10K 59/8731* (2023.02)

(58) Field of Classification Search
CPC . H10K 59/874; H10K 59/122; H10K 59/8731
See application file for complete search history.

(56) References Cited

U.S. PATENT DOCUMENTS 10,770,524 B2 9/2020 Lee et al.
2017/0025489 A1 1/2017 Choi
2024/0164186 A1 * 5/2024 Duan .................. H10K 59/874

FOREIGN PATENT DOCUMENTS

CN 106935724 7/2017
CN 108615822 10/2018
(Continued)

OTHER PUBLICATIONS

International Search Report and the Written Opinion Dated Nov. 25, 2022 From the International Searching Authority Re. Application No. PCT/CN2022/093783 and its Translation Into English. (18 Pages).
(Continued)

*Primary Examiner* — Mark V Prenty

(57) ABSTRACT

A display panel is provided by the present application. The display panel includes an array substrate, a planarization layer, a blocking member, a pixel definition layer, and a light-emitting layer. Wherein, the planarization layer is disposed on the array substrate. The blocking member is disposed on a surface of the planarization layer away from the array substrate. The pixel definition layer is disposed on the surface of the planarization layer away from the array substrate, the blocking member penetrates through the pixel definition layer, and the pixel definition layer includes a plurality of openings. The light-emitting layer includes a plurality of light-emitting parts, and one of the light-emitting parts is disposed in one of the openings.

18 Claims, 3 Drawing Sheets

(56) References Cited

FOREIGN PATENT DOCUMENTS

| | | |
|---|---|---|
| CN | 109841655 | 6/2019 |
| CN | 110085772 | 8/2019 |
| CN | 110491929 | 11/2019 |
| CN | 111697153 | 9/2020 |
| CN | 111725428 | 9/2020 |
| CN | 113345336 | 9/2021 |

OTHER PUBLICATIONS

Notification of Office Action and Search Report Dated Nov. 26, 2024 From |The State Intellectual Property Office of the People's Republic of China Re. Application No. 202210458577.1 and its Translation Into English. (15 Pages).

* cited by examiner

DISPLAY PANEL

RELATED APPLICATIONS

This application is a National Phase of PCT Patent Application No. PCT/CN2022/093783 having International filing date of May 19, 2022, which claims the benefit of priority of Chinese Patent Application No. 202210458577.1 filed on Apr. 27, 2022. The contents of the above applications are all incorporated by reference as if fully set forth herein in their entirety.

FIELD AND BACKGROUND OF THE INVENTION

The present application relates to a field of display technology, in particular to a display panel.

An organic light-emitting diode (OLED) display panel has characteristics of self-luminescence, high brightness, wide viewing angle, high contrast, flexibility, and low energy consumption, therefore it has received extensive attention. As a new generation of display methods, OLED display has begun to gradually replace traditional liquid crystal displays (LCDs), and is widely used in mobile phone screens, computer monitors, full-color TVs, etc.

In an OLED display device, a light-emitting layer is made of organic polymers, and a cathode is made of magnesium and silver, all of which are sensitive to water and oxygen. Water and oxygen affect lifespan of OLED devices greatly, therefore, reducing water and oxygen infiltration is crucial. An existing pixel definition layer is a double layer structure, which does not block water and oxygen penetration. When a single pixel is eroded by water and oxygen, water and oxygen will spread around with the pixel definition layer, causing surrounding pixels to be eroded by water and oxygen, as a result, pixel failure is enlarged, which in turn causes a display panel to fail.

Therefore, it is necessary to propose a new technical solution to solve the above-mentioned technical problems.

SUMMARY OF THE INVENTION

Embodiments of the present application provide a display panel for improving a problem of failure of the display panel caused by water and oxygen erosion.

The present application provides a display panel, including:

- an array substrate;
- a planarization layer, disposed on the array substrate;
- a blocking member, disposed on a surface of the planarization layer away from the array substrate;
- a pixel definition layer, disposed on the surface of the planarization layer away from the array substrate, and the blocking member penetrates through the pixel definition layer, the pixel definition layer including a plurality of openings; and
- a light-emitting layer, the light-emitting layer including a plurality of light-emitting parts, and one of the light-emitting parts disposed in one of the openings.

Optionally, in the embodiments of the present application, the blocking member includes a plurality of first blocking members and a plurality of second blocking members, the plurality of first blocking members extend along a first direction, the plurality of second blocking members extend along a second direction, the first blocking members and the second blocking members intersect to form a plurality of blocking walls, and one of the blocking walls surrounds one of the light-emitting parts.

Optionally, in the embodiments of the present application, the blocking member includes a plurality of first blocking members and a plurality of second blocking members, the plurality of first blocking members extend along a first direction, the plurality of second blocking members extend along a second direction, the first blocking members and the second blocking members intersect to form a plurality of blocking walls, at least one of the blocking walls surrounds one of the light-emitting parts, and at least one of the blocking walls surrounds a plurality of the light-emitting parts.

Optionally, in the embodiments of the present application, the blocking member includes a plurality of blocking walls, and any one of the blocking walls is disposed around one of the light-emitting parts.

Optionally, in the embodiments of the present application, any one of the blocking walls is a single blocking wall structure.

Optionally, in the embodiments of the present application, each of the blocking walls includes a first blocking wall and a second blocking wall, the first blocking wall is disposed on the planarization layer, and the second blocking wall is disposed on a side of the first blocking wall adjacent to or away from one of the openings.

Optionally, in the embodiments of the present application, each of the blocking walls further includes a third blocking wall, and the third blocking wall is disposed on a side of the second blocking wall away from the first blocking wall.

Optionally, in the embodiments of the present application, an ability of the first blocking wall and an ability of the third blocking wall to block water and oxygen are greater than an ability of the second blocking wall to block water and oxygen.

Optionally, in the embodiments of the present application, materials of the first blocking wall and the third blocking wall include at least one of silicon nitride, silicon oxide, silicon oxynitride, aluminum, silver, aluminum oxide, or silver oxide, and a material of the second blocking wall includes at least one of silicon nitride, silicon oxide, silicon oxynitride, aluminum, silver, aluminum oxide, silver oxide, and organic polymers.

Optionally, in the embodiments of the present application, the material of the first blocking wall is aluminum, the material of the second blocking wall is epoxy resin, and a material of the third blocking wall is silver.

Optionally, in the embodiments of the present application, a surface of the blocking member away from the planarization layer is higher than a surface of the light-emitting layer away from the planarization layer.

Optionally, in the embodiments of the present application, the surface of the blocking member away from the planarization layer is flush with a surface of the pixel definition layer away from the planarization layer.

Optionally, in the embodiments of the present application, the planarization layer is defined with a groove, and the blocking member is disposed in the groove.

Optionally, in the embodiments of the present application, a height of the blocking member ranges from 0.5 microns to 3 microns.

Optionally, in the embodiments of the present application, each of the light-emitting parts is disposed in the blocking member.

Optionally, in the embodiments of the present application, the display panel further includes:

- an anode, disposed on the surface of the planarization layer away from the array substrate, and electrically connected to the array substrate, each of the openings exposes a part of the anode;
- a cathode, disposed on the surface of the pixel definition layer away from the anode.

Optionally, in the embodiments of the present application, the display panel further includes:

- an encapsulation layer, the encapsulation layer is disposed on a surface of the light-emitting layer away from the planarization layer, and the encapsulation layer includes a first inorganic encapsulation layer, an organic encapsulation layer, and a second inorganic encapsulation layer stacked in sequence.

Optionally, in the embodiments of the present application, the pixel definition layer includes a first pixel definition layer and a second pixel definition layer, the first pixel definition layer is disposed on the surface of the planarization layer away from the array substrate, and the first pixel definition layer is lyophilic, the second pixel definition layer is disposed on a surface of the first pixel definition layer away from the planarization layer, and the second pixel definition layer is lyophobic.

Advantageous Effects

Embodiments of the present application provide a display panel, the display panel includes an array substrate, a planarization layer, a blocking member, a pixel definition layer and a light-emitting layer. Wherein, the planarization layer is disposed on the array substrate. The blocking member is disposed on a surface of the planarization layer away from the array substrate. The pixel definition layer is disposed on a surface of the planarization layer away from the array substrate, and the blocking member penetrating through the pixel definition layer, and the pixel definition layer includes a plurality of openings. The light-emitting layer includes a plurality of light-emitting parts, and each of the light-emitting parts is disposed in one of the openings. In the embodiment of the present application, the blocking member is disposed on the planarization layer to prevent water and oxygen eroding the light-emitting layer from sides, thereby preventing the failure of the display panel. Therefore, the display panel provided by the embodiments of the present application can be used to improve a problem of the failure of the display panel caused by water and oxygen erosion.

BRIEF DESCRIPTION OF THE SEVERAL VIEWS OF THE DRAWINGS

In order to more clearly illustrate the embodiments or the technical solutions of the existing art, the drawings illustrating the embodiments, or the existing art will be briefly described below. The drawings in the following description merely illustrate some embodiments of the present application. Other drawings may also be obtained by those skilled in the art according to these figures without paying creative work.

DESCRIPTION OF SPECIFIC EMBODIMENTS OF THE INVENTION

Figure 1:
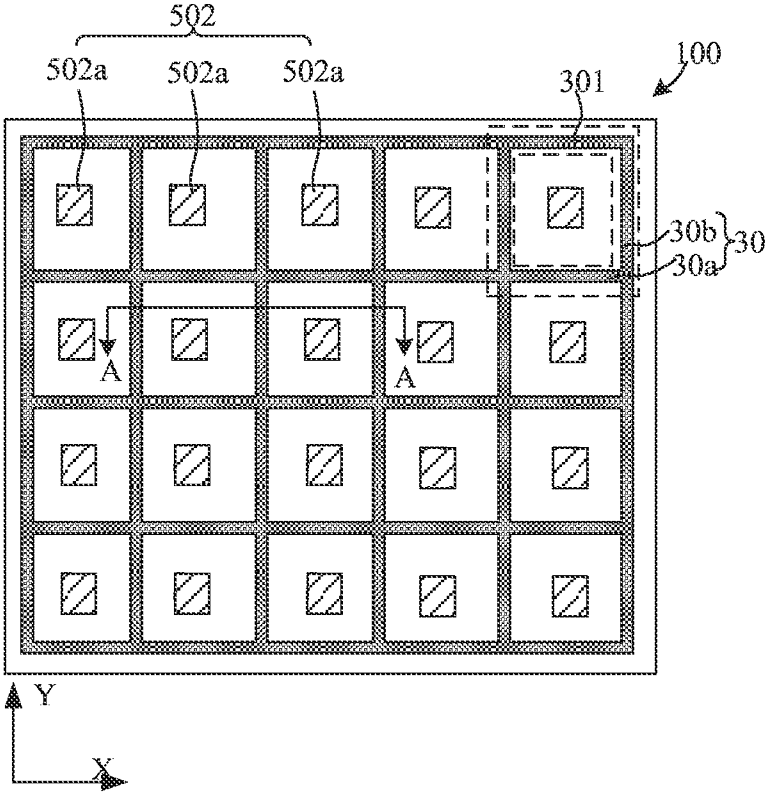
FIG. 1 is a first planar schematic structural diagram of a display panel provided by an embodiment of the present application.

In order to make the objective, technical solution and advantages of the present application clearer, the present application will be further described in detail below with reference to the accompanying drawings. Referring to the figures in the accompanying drawings. The components with the same reference numbers represent the same or similar components. The following description is based on the illustrated specific embodiments of the present disclosure and should not be construed to limit the other specific embodiments which are not described in detail herein. The word "embodiment" configured in this specification means an example, example, or illustration.

In the description of the present disclosure, it is to be understood that the azimuth or positional relationships indicated by the terms "center", "longitudinal", "transverse", "length", "width", "thickness", "upper", "lower", "front", "back", "left", "right", "vertical", "horizontal", "top", "bottom", "inside", "outside", "clockwise", "counter-clockwise", etc., are based on the azimuth or positional relationship shown in the drawings, merely for the purpose of assisting and simplify the description, rather than indicating or implying that the indicated device or element must have a specific orientation, and be constructed and operated in a particular orientation. Therefore, these terms cannot be construed as limiting the present disclosure. In addition, the terms "first" and "second" are only configured for descriptive purposes and cannot be understood as indicating or implying relative importance or implicitly indicating the number of indicated technical features. Therefore, the features defined with "first" and "second" may explicitly or implicitly include one or more of the features. In the description of the present application, "a plurality of" means two or more than two, unless otherwise specifically defined.

Embodiments of the present application provide a display panel. Each will be described in detail below. It should be noted that the description order of the following embodiments is not intended to limit the preferred order of the embodiments.

Embodiments of the present application provide a display panel, the display panel includes an array substrate, a planarization layer, a blocking member, a pixel definition layer, and a light-emitting layer. Wherein, the planarization layer is disposed on the array substrate. The blocking member is disposed on a surface of the planarization layer away from the array substrate. The pixel definition layer is disposed on the surface of the planarization layer away from the array substrate, the blocking member penetrates through the pixel definition layer, and the pixel definition layer includes a plurality of openings. The light-emitting layer includes a plurality of light-emitting parts, and one of the light-emitting parts is disposed in one of the openings. In the embodiment of the present application, the blocking member is disposed on the planarization layer to prevent water and oxygen eroding the light-emitting layer from sides, thereby preventing failure of the display panel. Therefore, the display panel provided by the embodiments of the present application can be used to improve a problem of the failure of the display panel caused by water and oxygen erosion.

The display panel provided by the present application will be described in detail below through specific embodiments.

Figure 2:
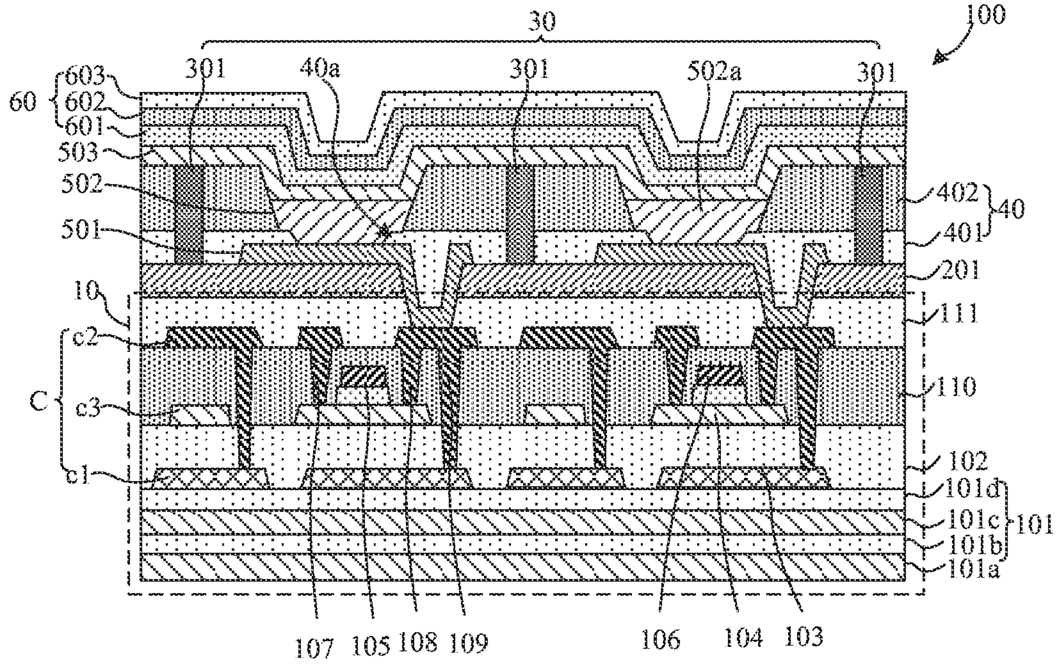
FIG. 2 is a first cross-sectional view of the display panel taken along an A-A direction of FIG. 1.

Please refer to FIG. 1 and FIG. 2, FIG. 1 is a first planar schematic structural diagram of a display panel provided by an embodiment of the present application. FIG. 2 is a first cross-sectional view of the display panel taken along an A-A direction of FIG. 1. An embodiment of the present application provides a display panel 100, the display panel 100 includes an array substrate 10, a planarization layer 201, a blocking member 30, a pixel definition layer 40, and a light-emitting layer 502. The planarization layer 201 is disposed on the array substrate 10. The blocking member 30 is disposed on a surface of the planarization layer 201 away from the array substrate 10. The pixel definition layer 40 is disposed on a surface of the planarization layer 201 away from the array substrate 10, the blocking member 30 penetrating through the pixel definition layer 40, and the pixel definition layer 40 including a plurality of openings 40*a*. The light-emitting layer 502 includes a plurality of light-emitting parts 502*a*, and each of the light-emitting parts 502*a* is disposed in one of the openings 40*a*. In the embodiment of the present application, the blocking member 30 is disposed on the planarization layer 201 to prevent water and oxygen eroding the light-emitting layer 502 from a surface side, thereby preventing failure of the display panel 100. Therefore, the display panel 100 provided by the embodiments of the present application can improve a capability of isolating water and oxygen, so that adjacent pixel units are not affected by the water vapor of a single pixel unit, thereby improving a problem of the failure of the display panel 100 due to water and oxygen erosion.

Wherein, the array substrate 10 includes a substrate 101, a buffer layer 102, a light shielding layer 103, an active layer 104, a gate insulating layer 105, a gate electrode 106, a source electrode 107, a drain electrode 108, an auxiliary electrode 109, an interlayer dielectric layer 110, and a passivation layer 111. The buffer layer 102 is disposed on a surface of the light shielding layer 103 away from the substrate 101. The active layer 104 is disposed on a surface of the buffer layer 102 away from the substrate 101. The gate insulating layer 105 is disposed on a surface of the active layer 104 away from the buffer layer 102. The gate electrode 106 is disposed on a surface of the gate insulating layer 105 away from the active layer 104. The source electrode 107 and the drain electrode 108 are electrically connected to the active layer 104 through contact holes, respectively. The auxiliary electrode 109 is disposed in a via hole for connecting the drain electrode 108 and the light shielding layer 103. The interlayer dielectric layer 110 covers the gate electrode 106, the active layer 104, and the buffer layer 102. The passivation layer 111 covers the source electrode 107, the drain electrode 108, and the interlayer dielectric layer 110. In the embodiment of the present application, since the light shielding layer 103 is electrically connected to the drain electrode 108, the light shielding layer 103 not only can be used to shield the active layer 104 from light, but also prevent the light from affecting stability of the active layer 104; in addition, the light shielding layer 103 and the drain electrode 108 are electrically connected, since the light shielding layer 103 has overlapping regions with the active layer 104 and the gate electrode 106, parasitic capacitances are formed between the light shielding layer 103, the active layer 104, and the gate electrode 106 respectively. When the display panel 100 is operating, a voltage on the drain electrode 108 will change with the different voltages applied on data signal lines, so that a voltage on the light shielding layer 103 will also change accordingly, thereby affecting electrical properties of the active layer 104. In the present application, the light shielding layer 103 and the drain electrode 108 are connected to form an equipotential, which can prevent a voltage change on the light shielding layer 103 from affecting the electrical properties of the active layer 104.

It should be noted that a thin film transistor of the array substrate 10 in the embodiment of the present application may be a single-gate thin film transistor or a double-gate thin film transistor; it may be a top-gate thin film transistor or a bottom-gate thin film transistor. The embodiments of the application are described by taking a top-gate thin film transistor as an example, but are not limited to this.

In some embodiments, the substrate 101 may include a first flexible layer 101*a*, a first barrier layer 101*b*, a second flexible layer 101*c*, and a second barrier layer 101*d* stacked in sequence. The light shielding layer 103 is disposed on a surface of the second barrier layer 101*d* away from the second flexible layer 101*c*.

The first barrier layer 101*b* is used to prevent water and oxygen from penetrating into structures above the first barrier layer 101*b* through a side of the first flexible layer 101*a*, thereby preventing damage to the array substrate 10. In some embodiments, materials of the first barrier layer 101*b* and the second barrier layer 101*d* include but are not limited to silicon-containing oxides, nitrides, or oxynitrides. For example, a material of the first barrier layer 101*b* is at least one of $SiO_x$, $SiN_x$ or $SiO_xN_y$, and a material of the second barrier layer 101*d* is at least one of $SiO_x$, $SiN_y$ or $SiO_xN_y$. A material of the first flexible layer 101*a* may be same as a material of the second flexible layer 101*c*, which may include at least one of polyimide (PI), polyethylene terephthalate (PET), polyethylene naphthalate (PEN), polycarbonate (PC), polyethersulfone (PES), aromatic fluorotoluene containing polyarylate (PAR), or polycyclic olefin (PCO).

In some embodiments, materials of the light shielding layer 103, the gate electrode 106, the source electrode 107, the drain electrode 108, and the auxiliary electrode 109 include one of silver (Ag), magnesium (Mg), aluminum (Al), tungsten (W), copper (Cu), nickel (Ni), chromium (Cr), molybdenum (Mo), titanium (Ti), platinum (Pt), tantalum (Ta), neodymium (Nd), or scandium (Sc) metals, their alloys, their nitrides, or any combination thereof. Materials of the buffer layer 102, the gate insulating layer 105, the interlayer dielectric layer 110, and the passivation layer 111 include one of silicon oxide, silicon nitride, silicon oxynitride, or any combination thereof.

In some embodiments, the display panel 100 further includes a storage capacitor C, the storage capacitor C includes a first electrode plate c1 and a second electrode plate c2, and the first electrode plate c1 and the light shielding layer 103 are of a same layer and material. The second electrode plate c2 and the source electrode 107 are of a same layer and material. An orthographic projection of the first electrode plate c1 on the substrate 101 covers an orthographic projection of the second electrode plate c2 on the substrate 101. In the embodiment of the present application, since the first electrode plate c1 and the light shielding layer 103 are of the same layer and material, and the second electrode plate c2 and the source electrode 107 are of the same layer and material, a manufacturing process of the display panel 100 can be simplified.

Optionally, in some embodiments, the storage capacitor C includes the first electrode plate c1, the second electrode plate c2, and a third electrode plate c3. The first electrode plate c1 and the light shielding layer 103 are of the same layer and material. The second electrode plate c2 and the source electrode 107 are of the same layer and material. The third electrode plate c3 and the active layer 104 are of a same layer and material. The orthographic projection of the first electrode plate c1 on the substrate 101 covers the orthographic projection of the second electrode plate c2 on the substrate 101. The orthographic projection of the first electrode plate c1 on the substrate 101 covers an orthographic projection of the third electrode plate c3 on the substrate 101. The second electrode plate c2 is electrically connected to the first electrode plate c1. In the embodiment of the present application, a structure of the storage capacitor C is disposed as a sandwich structure, that is, the first electrode plate c1 and the third electrode plate c3 can be regarded as a first sub-storage capacitor, and the second electrode plate c2 and the third electrode plate c3 can be regarded as a second sub-storage capacitor. The first sub-storage capacitor and the second sub-storage capacitor are designed in parallel, which increases a capacity of the capacitor to store charge. In addition, since the third electrode plate c3 and the active layer 104 are disposed in the same layer, the third electrode plate c3 can be formed at a same time as the active layer 104 is formed. Therefore, there is no need to add a mask, which simplifies the manufacturing process of the display panel 100. It should be understood that the third electrode plate c3 is formed by conducting a semiconductor material.

The planarization layer 201 is disposed on the passivation layer 111. A material of the planarization layer 201 may be an organic material. For example, the material of the planarization layer 201 may be acrylic resin.

Please continue to refer to FIG. 1, the blocking member 30 includes a plurality of first blocking members 30*a* and a plurality of second blocking members 30*b*. The plurality of first blocking members 30*a* extend along a first direction X and are arranged along a second direction Y. The plurality of second blocking members 30*b* extend along the second direction Y and are arranged along the first direction X. The first blocking members 30*a* and the second blocking members 30*b* intersect to form a plurality of blocking walls 301, and one of the blocking walls 301 surrounds one of the light-emitting parts 502*a*. In the embodiment of the present application, two adjacent blocking walls 301 share a part to form an annular blocking wall arranged around each of the light-emitting parts 502*a*, this arrangement can be used to save space of the display panel 100 when two adjacent sub-pixels are densely arranged. In addition, this arrangement can also save a material cost of the blocking member 30.

In some embodiments, each of the light-emitting parts 502*a* is disposed in the blocking member 30, so as to protect all the light-emitting parts 502*a* from water and oxygen intrusion and improve an overall stability of the display panel 100.

In some embodiments, any one of the blocking walls 301 is a single blocking wall structure. When the blocking walls 301 are the single blocking wall structure, its material can be at least one of silicon nitride, silicon oxide, silicon oxynitride, aluminum, silver, aluminum oxide, or silver oxide. In the embodiment of the present application, the blocking walls 301 are the single blocking wall structure, which can simplify a manufacturing process of the blocking walls 301.

Figure 3:
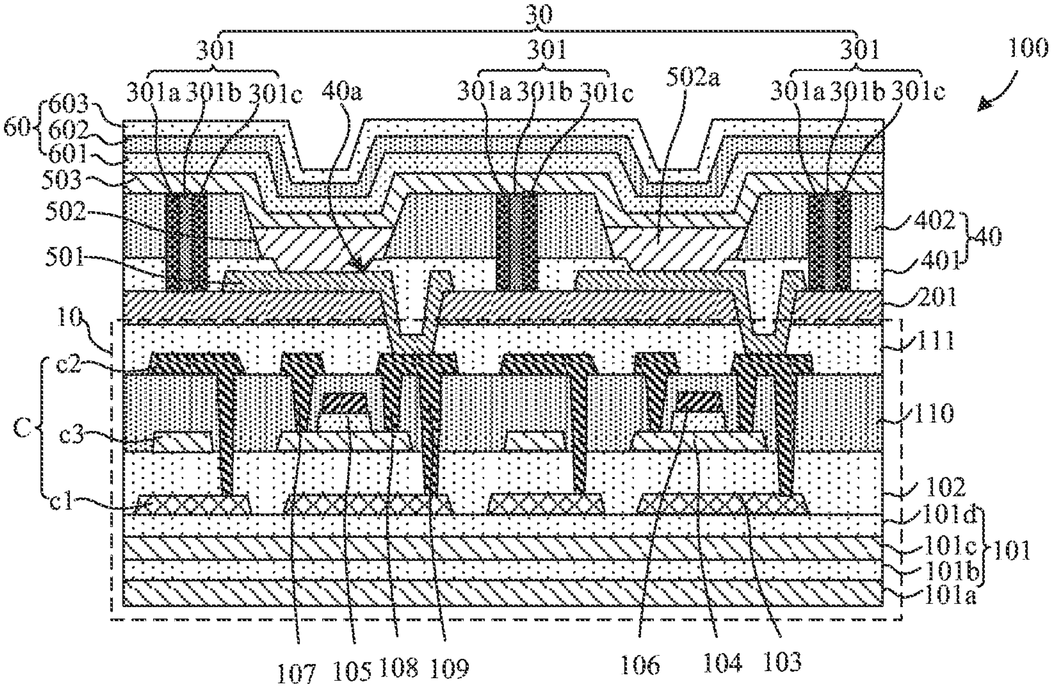
FIG. 3 is a second cross-sectional view of the display panel taken along the A-A direction of FIG. 1.

Please refer to FIG. 3, FIG. 3 is a second cross-sectional view of the display panel taken along the A-A direction of FIG. 1. In some embodiments, each of the blocking walls 301 includes a first blocking wall 301*a* and a second blocking wall 301*b*, the first blocking wall 301*a* is disposed on the planarization layer 201, and the second blocking wall 301*b* is disposed on a side of the first blocking wall 301*a* adjacent to or away from one of the openings 40*a*. In the embodiment of the present application, any one of the blocking walls 301 is a double-layer structure, which extends a path of water and oxygen erosion, and further improves the problem of the failure of the display panel 100 caused by water and oxygen erosion.

In another embodiment, each of the blocking walls 301 includes the first blocking wall 301*a*, the second blocking wall 301*b*, and a third blocking wall 301*c*. The second blocking wall 301*b* is disposed on the side of the first blocking wall 301*a* adjacent to or away from one of the openings 40*a*, and the third blocking wall 301*c* is disposed on a side of the second blocking wall 301*b* away from the first blocking wall 301*a*. In one embodiment, the first blocking wall 301*a* is disposed on the surface of the planarization layer 201 away from the array substrate 10. The second blocking wall 301*b* is disposed on the side of the first blocking wall 301*a* adjacent to or away from one of the openings 40*a*. The third blocking wall 301*c* is disposed on the side of the second blocking wall 301*b* away from the first blocking wall 301*a*. In the embodiment of the present application, the blocking wall is a three-layer structure, which further extends the path of water and oxygen intrusion, thereby further improving the problem of the failure of the display panel 100 caused by water and oxygen erosion.

In some embodiments, an ability of the first blocking wall 301*a* and an ability of the third blocking wall 301*c* to block water and oxygen are greater than an ability of the second blocking wall 301*b* to block water and oxygen. Since the first blocking wall 301*a* on a side of away from the light-emitting part 502*a* has a strong ability of blocking water and oxygen, more water and oxygen intrusion can be blocked, thereby preventing the failure of the display panel 100.

In some embodiments, materials of the first blocking wall 301*a* and the third blocking wall 301*c* include at least one of silicon nitride, silicon oxide, silicon oxynitride, aluminum, silver, aluminum oxide, or silver oxide. A material of the second blocking wall 301*b* includes at least one of silicon nitride, silicon oxide, silicon oxynitride, aluminum, silver, aluminum oxide, silver oxide, and an organic polymer. For example, in a specific embodiment, the material of the first blocking wall 301*a* is aluminum, the material of the second blocking wall 301*b* is epoxy resin, and the material of the third blocking wall 301*c* is silver. Since the materials of the first blocking wall 301*a* and the third blocking wall 301*c* are transparent metal materials, when eroded by water and oxygen, oxygen reacts with aluminum and silver to form dense aluminum oxide films and silver oxide films, thereby preventing further intrusion of water and oxygen, and improving the stability of the display panel 100. The material of the second blocking wall 301*b* is epoxy resin, and since a flexibility of the epoxy resin is greater than that of a metal material, it can provide force to the display panel 100 to meet bending requirements of the display panel 100.

Figure 4:
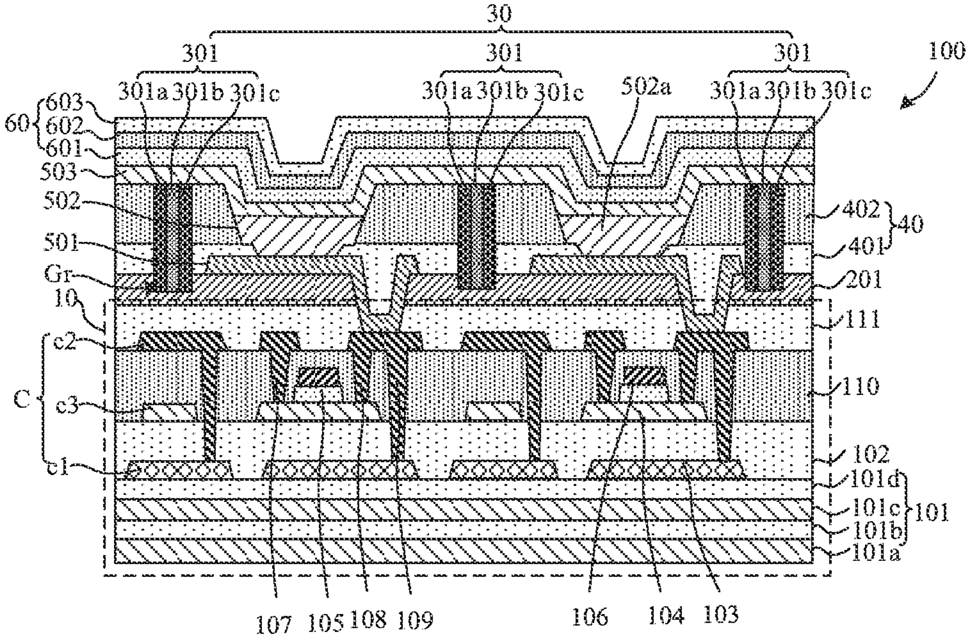
FIG. 4 is a third cross-sectional view of the display panel taken along the A-A direction of FIG. 1.

Please refer to FIG. 4, FIG. 4 is a third cross-sectional view of the display panel taken along the A-A direction of FIG. 1. In some embodiments, the planarization layer 201 provides a groove Gr, and the blocking member 30 is disposed in the groove Gr. In the embodiment of the present application, by defining the groove Gr on the planarization layer 201 and snapping the blocking member 30 in the groove Gr, a stability between the planarization layer 201 and the blocking member 30 is increased.

In some embodiments, a surface of the blocking member 30 away from the planarization layer 201 is higher than a surface of the light-emitting layer 502 away from the planarization layer 201. In the embodiment of the present application, since the surface of the blocking member 30 away from the planarization layer 201 is higher than the surface of the light-emitting layer 502 away from the planarization layer 201, sides of the blocking member 30 is used to block the intrusion of water and oxygen from the sides and prevent damage to the display panel 100.

In another embodiment, the surface of the blocking member 30 away from the planarization layer 201 is flush with a surface of the pixel definition layer 40 away from the planarization layer 201. Since the blocking member 30 is flush with the pixel definition layer 40, the intrusion of water and oxygen from the side is further blocked, damage to the display panel 100 is prevented, and the stability of the display panel 100 is improved.

In some embodiments, a height of the blocking member 30 ranges from 0.5 microns to 3 microns. For example, the height of the blocking member 30 may be any one of 0.5 microns, 0.8 microns, 1.0 microns, 1.2 microns, 1.5 microns, 2.0 microns, 2.5 microns, or 3 microns. In the embodiment of the present application, by setting the height of the blocking member 30 ranges from 0.5 microns to 3 microns, the intrusion of water and oxygen is blocked, and the stability of the display panel 100 is improved.

It should be noted that the height of the blocking member 30 is a distance between a surface of the blocking member 30 in contact with the planarization layer 201 and a surface of the blocking member 30 away from the planarization layer 201.

In some embodiments, the pixel definition layer 40 includes a first pixel definition layer 401 and a second pixel definition layer 402, and the first pixel definition layer 401 is disposed on a surface of the planarization layer 201 away from the array substrate 10. The first pixel definition layer 401 is lyophilic. The second pixel definition layer 402 is disposed on a surface of the first pixel definition layer 401 away from the planarization layer 201. The second pixel definition layer 402 is lyophobic.

Lyophilicity means that a surface of a material is easily wetted or melted by a liquid medium. Lyophobicity is an opposite of lyophilicity, which means that a surface of a material is not easily wetted or melted by the liquid medium. The lyophilic and lyophobic properties of material surfaces are mainly determined by properties of their surface structures or functional groups. In the present application, lyophilicity of the pixel definition layer 40 can be changed and adjusted by adjusting the process parameters, such as parameters of developing process and curing process. Changing and adjusting the lyophilicity and lyophobicity of the pixel definition layer 40 can be adapted to different printing processes, ink types, and film thicknesses, so that the pixel definition layer 40 can be more easily adapted to requirements of different display panels.

Specifically, a thickness of a material of the pixel definition layer 40 will affect the lyophobicity of the material. For example, when the lyophobic material is very thin, it has no lyophobicity. In addition, oxygen ($O_2$) or nitrogen ($N_2$) plasma treatment of the material can turn lyophobicity into lyophilicity, and fluorine gas (F) plasma treatment of the material can turn lyophilicity into lyophobicity.

Optionally, the pixel definition layer 40 has a line-bank structure, that is, at least one of the openings in the pixel definition layer 40 in the panel is a through-stripe opening, so that the pixel definition layer 40 also has a through-stripe shape. The pixel defining layer 40 of the line-bank structure is more conducive to obtaining better uniformity of organic molecules formed in the film by inkjet printing.

The display panel 100 further includes an anode 501 and a cathode 503. The anode 501 is disposed on a surface of the planarization layer 201 away from the array substrate 10 and is electrically connected to the array substrate 10. Each of the openings 40*a* exposes a part of the anode 501. Each of the light-emitting parts 502*a* is defined in one of the openings 40*a*. The blocking member 30 surrounds the light-emitting parts 502*a*. The cathode 503 is disposed on a surface of the pixel definition layer 40 away from the anode 501.

In some embodiments, the light-emitting layer 502 may be fabricated by an inkjet printing (IJP) process. A material concentration of the light-emitting layer 502 in the inkjet printing is low, and more light-emitting layer 502 materials need to be printed to achieve a target film thickness, however, many materials of the light-emitting layer 502 are usually prone to overflow an opening during printing, and are bridged with materials of the light-emitting layer 502 of other colors, resulting in color mixing. In the embodiment of the present application, the surface of the pixel definition layer 40 close to the array substrate 10 is lyophilic, and the surface away from the array substrate 10 is lyophobic, so that color mixing due to overflow of the light-emitting layer 502 can be avoided.

In some embodiments, a material of anode 501 includes any one of indium gallium zinc oxide, indium zinc tin oxide, indium gallium zinc tin oxide, indium tin oxide (ITO), indium zinc oxide, indium aluminum zinc oxide, indium gallium tin oxide, or antimony tin oxide. The above materials have good conductivity and transparency, and thicknesses are small, which will not affect an overall thickness of the display panel. At a same time, it can also reduce harmful electron radiation and ultraviolet and infrared light. For example, the material of the anode 501 may be a laminate of ITO/Ag/ITO.

In some implementations, a material of cathode 503 can be at least one of magnesium or silver.

In some embodiments, the display panel 100 further includes a hole transport layer, a hole injection layer, an electron transport layer, and an electron injection layer. The hole injection layer is disposed on a surface of the anode 501 away from the planarization layer 201. The hole transport layer is disposed on a surface of the hole injection layer away from the anode 501. The electron transport layer is disposed on a surface of the light-emitting layer 502 away from the anode 501. The electron injection layer is disposed on a surface of the electron transport layer away from the light-emitting layer. In this embodiment of the present application, the hole transport layer, the hole injection layer, the electron transport layer, and the electron injection layer are provided to improve a luminous efficiency of the display panel 100.

In some embodiments, the display panel 100 further includes an encapsulation layer 60. The encapsulation layer 60 is disposed on a surface of the cathode 503 away from the planarization layer 201. The encapsulation layer 60 includes a first inorganic encapsulation layer 601, an organic encapsulation layer 602, and a second inorganic encapsulation layer 603 stacked in sequence. In some embodiments, materials of the first inorganic encapsulation layer 601 and the second inorganic encapsulation layer 603 may be selected from silicon dioxide, nitrogen dioxide, silicon oxynitride, and stacks thereof. A material of the organic encapsulation layer 602 is selected from organic materials such as epoxy resin, polyimide (PI), polyethylene terephthalate (PET), polycarbonate (PC), polyethylene (PE), and polyacrylate.

Figure 5:
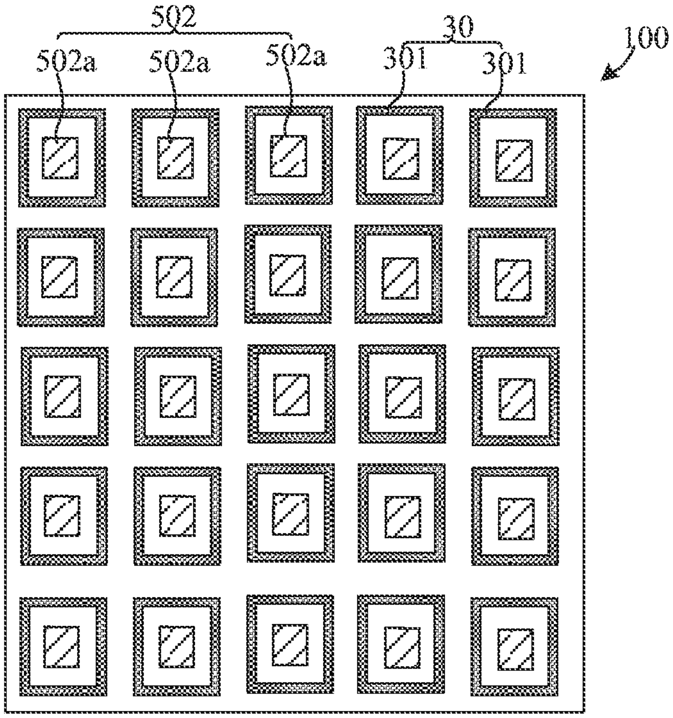
FIG. 5 is a second planar schematic structural diagram of the display panel provided by an embodiment of the present application.

Please refer to FIG. 5, FIG. 5 is a second planar schematic structural diagram of the display panel provided by an embodiment of the present application. A difference between the display panel 100 provided in this embodiment of the present application and the display panel 100 provided in FIG. 1 is that the blocking member 30 includes the plurality of blocking walls 301, and any one of the blocking walls 301 is disposed around one of the light-emitting parts 502*a*. Since one of the blocking walls 301 is disposed corresponding to one of the light-emitting parts 502*a*, therefore, a structure with the plurality of blocking walls 301 between any two adjacent light-emitting parts 502*a* extends the path of water and oxygen intrusion, and further improves the stability of the display panel 100.

Figure 6:
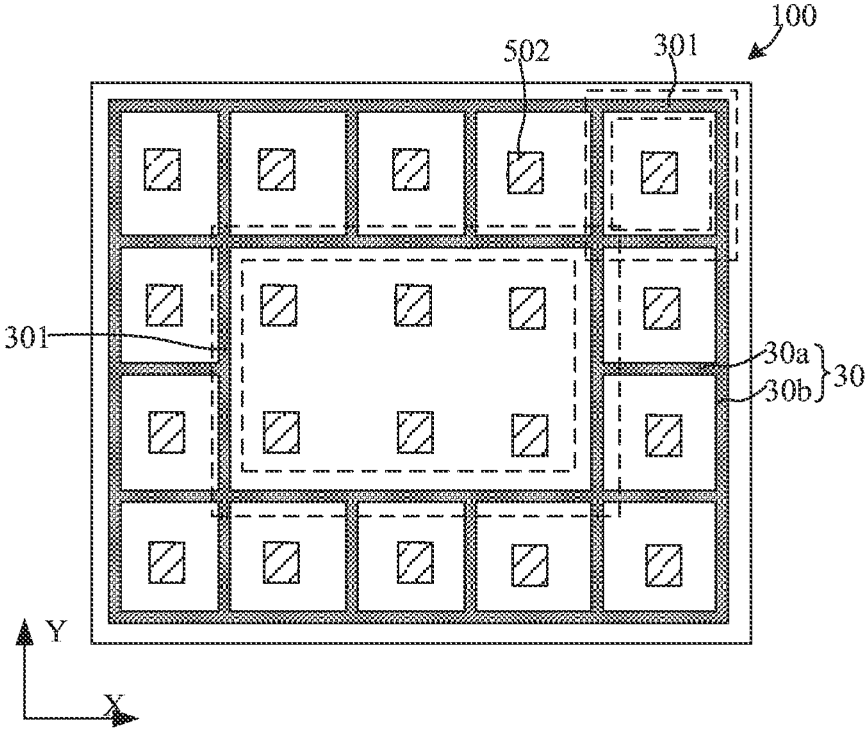
FIG. 6 is a third planar schematic structural diagram of the display panel provided by an embodiment of the present application.

Please refer to FIG. 6, FIG. 6 is a third planar schematic structural diagram of the display panel provided by an embodiment of the present application. A difference between the display panel 100 provided in this embodiment of the present application and the display panel 100 provided in FIG. 1 is that at least one of the blocking walls 301 surrounds one of the light-emitting parts 502*a*, and at least one of the blocking walls 301 surrounds a plurality of the light-emitting parts 502*a*. Since water and oxygen diffuse from edges of the display panel 100 to a middle, making the display panel 100 fail, therefore, only the blocking member 30 is provided in a peripheral portion of the display panel 100 in the embodiment of the present application, and an area near the middle of the display panel 100 does not need to be provided the blocking member 30, that is, in an area close to a center of the display panel, a plurality of light-emitting parts 502*a* share one of the blocking walls 301, this arrangement can save the material cost of the blocking member 30.

It should be noted that, in the embodiment of the present application, lengths of the plurality of first blocking members 30*a* may be different, and lengths of the plurality of second blocking members 30*b* may also be different, so as to form the blocking walls 301 (as indicated by the dashed box). It should be understood that, in the embodiment of the application, the blocking wall 301 is a smallest closed structure formed by an intersection of the first blocking members 30*a* and the second blocking members 30*b* (as shown by the dotted frame).

It should be noted that the display panel 100 may be an active light-emitting display panel, such as an organic light-emitting diode (OLED) display panel, an active-matrix organic light-emitting diode (AMOLED) display panel, a passive-matrix organic light-emitting diode (PMOLED) display panel, a quantum dot light-emitting diode (QLED) display panel, a micro light-emitting diode (micro-LED) display panel, and a sub-millimeter light-emitting diode (mini-LED) display panel, etc.

Correspondingly, an embodiment of the present application further provides a manufacturing method of a display panel, and the manufacturing method of the display panel includes following steps:

Step B001: providing an array substrate.

Wherein, manufacturing method of the array substrate belongs to a prior art and will not be repeated here.

Step B002: forming a planarization layer on the array substrate.

Specifically, coating an organic material on the array substrate, such as acrylic resin, to form the planarization layer.

Step B003: forming an anode on the planarization layer, and the anode is electrically connected to the array substrate through a via hole.

Specifically, bombarding a first electrode material under an action of plasma or electric field, and the molecules, atoms, ions, and electrons of the first electrode material are sputtered out, and the sputtered first electrode material has certain kinetic energy, and is emitted toward the array substrate in a certain direction, thereby forming the first electrode material on the array substrate. Using a deposition method, a speed is fast, a film layer is dense, and an adhesion is better, which is very suitable for large-scale, high-efficiency industrial production.

After depositing the first electrode material, the first electrode material is patterned to obtain the anode.

Step B004: forming a blocking member on the planarization layer.

Specifically, in one embodiment, a blocking material is deposited on the planarization layer by plasma enhanced chemical vapor deposition (PECVD), and the blocking material is etched to form the blocking member.

In another embodiment, firstly, a first blocking material is deposited on the planarization layer by plasma enhanced chemical vapor deposition (PECVD), and the first blocking material is etched to form a first blocking wall. Next, a film is formed by a photolithography technology to form a second blocking material, and then the second blocking material is exposed and developed to form a second blocking wall. Finally, a third blocking material is deposited on the planarization layer by plasma enhanced chemical vapor deposition (PECVD), and the third blocking material is etched to form a third blocking wall, thereby forming the blocking member.

Step B005: forming a pixel definition layer on the planarization layer by a photolithography process.

Step B006: forming a light-emitting layer in an opening of the pixel definition layer through an inkjet printing or evaporation process.

Step B007: evaporating at least one of metal magnesium or silver over an entire surface to form a cathode.

Step B008: forming an encapsulation layer on the cathode.

In summary, although the present application has been disclosed in preferred embodiments as above, the above-mentioned preferred embodiments are not intended to limit the present application. Those of ordinary skill in the art can make various modifications without departing from the spirit and scope of the present application. Therefore, the protection scope of the present application is subject to the scope defined by the claims.

What is claimed is:

1. A display panel, comprising:
- an array substrate;
- a planarization layer, disposed on the array substrate;
- a blocking member, disposed on a surface of the planarization layer away from the array substrate;
- a pixel definition layer, disposed on the surface of the planarization layer away from the array substrate, and the blocking member penetrates through the pixel definition layer, the pixel definition layer comprising a plurality of openings; and
- a light-emitting layer, the light-emitting layer comprising a plurality of light-emitting parts, and one of the light-emitting parts disposed in one of the openings;

wherein the blocking member comprises a plurality of blocking walls, and any one of the blocking walls is disposed around one of the light-emitting parts; and wherein a surface of the blocking member away from the planarization layer is higher than a surface of the light-emitting layer away from the planarization layer.

2. The display panel according to claim 1, wherein the blocking member comprises a plurality of first blocking members and a plurality of second blocking members, the plurality of first blocking members extend along a first direction, the plurality of second blocking members extend along a second direction, the first blocking members and the second blocking members intersect to form a plurality of blocking walls, and one of the blocking walls surrounds one of the light-emitting parts.

3. The display panel according to claim 1, wherein the blocking member comprises a plurality of first blocking members and a plurality of second blocking members, the plurality of first blocking members extend along a first direction, the plurality of second blocking members extend along a second direction, the first blocking members and the second blocking members intersect to form a plurality of blocking walls, at least one of the blocking walls surrounds one of the light-emitting parts, and at least one of the blocking walls surrounds a plurality of the light-emitting parts.

4. The display panel according to claim 2, wherein any one of the blocking walls is a single blocking wall structure.

5. The display panel according to claim 2, wherein each of the blocking walls comprises a first blocking wall and a second blocking wall, the first blocking wall is disposed on the planarization layer, and the second blocking wall is disposed on a side of the first blocking wall adjacent to or away from one of the openings.

6. The display panel according to claim 5, wherein each of the blocking walls further comprises a third blocking wall, and the third blocking wall is disposed on a side of the second blocking wall away from the first blocking wall.

7. The display panel according to claim 6, wherein an ability of the first blocking wall and an ability of the third blocking wall to block water and oxygen are greater than an ability of the second blocking wall to block water and oxygen.

8. The display panel according to claim 7, wherein materials of the first blocking wall and the third blocking wall comprise at least one of silicon nitride, silicon oxide, silicon oxynitride, aluminum, silver, aluminum oxide, or silver oxide, and a material of the second blocking wall comprises at least one of silicon nitride, silicon oxide, silicon oxynitride, aluminum, silver, aluminum oxide, silver oxide, and organic polymers.

9. The display panel according to claim 8, wherein the material of the first blocking wall is aluminum, the material of the second blocking wall is epoxy resin, and the material of the third blocking wall is silver.

10. The display panel according to claim 1, wherein the surface of the blocking member away from the planarization layer is flush with a surface of the pixel definition layer away from the planarization layer.

11. The display panel according to claim 1, wherein the planarization layer is defined with a groove, and the blocking member is disposed in the groove.

12. The display panel according to claim 1, wherein a height of the blocking member ranges from 0.5 microns to 3 microns.

13. The display panel according to claim 1, wherein each of the light-emitting parts is disposed in the blocking member.

14. The display panel according to claim 1, wherein the display panel further comprises:

an anode, disposed on the surface of the planarization layer away from the array substrate, electrically connected to the array substrate, and one of the openings exposes a part of the anode;

a cathode, disposed on a surface of the pixel definition layer away from the anode.

15. The display panel according to claim 1, wherein the display panel further comprises:

an encapsulation layer, the encapsulation layer is disposed on a surface of the light-emitting layer away from the planarization layer, and the encapsulation layer comprises a first inorganic encapsulation layer, an organic encapsulation layer, and a second inorganic encapsulation layer stacked in sequence.

16. The display panel according to claim 1, wherein the pixel definition layer comprises a first pixel definition layer and a second pixel definition layer, the first pixel definition layer is disposed on the surface of the planarization layer away from the array substrate, and the first pixel definition layer is lyophilic; the second pixel definition layer is disposed on a surface of the first pixel definition layer away from the planarization layer, and the second pixel definition layer is lyophobic.

17. A display panel, comprising:

an array substrate;

a planarization layer, disposed on the array substrate;

a blocking member, disposed on a surface of the planarization layer away from the array substrate;

a pixel definition layer, disposed on the surface of the planarization layer away from the array substrate, and the blocking member penetrates through the pixel definition layer, the pixel definition layer comprising a plurality of openings; and a light-emitting layer, the light-emitting layer comprising a plurality of light-emitting parts, and one of the light-emitting parts disposed in one of the openings;

wherein the planarization layer is defined with a groove, and the blocking member is disposed in the groove.

18. A display panel, comprising:

an array substrate;

a planarization layer, disposed on the array substrate;

a blocking member, disposed on a surface of the planarization layer away from the array substrate;

a pixel definition layer, disposed on the surface of the planarization layer away from the array substrate, and the blocking member penetrates through the pixel definition layer, the pixel definition layer comprising a plurality of openings; and a light-emitting layer, the light-emitting layer comprising a plurality of light-emitting parts, and one of the light-emitting parts disposed in one of the openings;

wherein each of the light-emitting parts is disposed in the blocking member; and wherein the blocking member comprises a plurality of first blocking members and a plurality of second blocking members, the plurality of first blocking members extend along a first direction, the plurality of second blocking members extend along a second direction, the first blocking members and the second blocking members intersect to form a plurality of blocking walls, at least one of the blocking walls surrounds one of the light-emitting parts, and at least one of the blocking walls surrounds a plurality of the light-emitting parts.

* * * * *